(12) United States Patent
Cheng et al.

(10) Patent No.: US 10,065,852 B2
(45) Date of Patent: Sep. 4, 2018

(54) MEMS DEVICE AND MANUFACTURING METHOD THEREOF

(71) Applicant: TAIWAN SEMICONDUCTOR MANUFACTURING COMPANY LTD., Hsinchu (TW)

(72) Inventors: Chun-Wen Cheng, Hsinchu County (TW); Chia-Hua Chu, Hsinchu County (TW); Ming-Dao Wu, Hsin-Chu (TW); Tzu-Heng Wu, New Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/275,976

(22) Filed: Sep. 26, 2016

(65) Prior Publication Data
US 2018/0086624 A1    Mar. 29, 2018

(51) Int. Cl.
*B81B 3/00* (2006.01)
*B81C 1/00* (2006.01)
*H04R 19/00* (2006.01)

(52) U.S. Cl.
CPC ........ *B81B 3/0072* (2013.01); *B81C 1/00158* (2013.01); *B81B 2201/0257* (2013.01); *H04R 19/005* (2013.01); *H04R 2201/003* (2013.01)

(58) Field of Classification Search
None
See application file for complete search history.

(56) References Cited

U.S. PATENT DOCUMENTS

| | | |
|---|---|---|
| 8,987,059 B2 | 3/2015 | Liang et al. |
| 9,040,334 B2 | 5/2015 | Chu et al. |
| 9,065,358 B2 | 6/2015 | Tsai et al. |
| 9,085,455 B2 | 7/2015 | Cheng et al. |
| 9,085,456 B2 | 7/2015 | Tsai et al. |
| 9,122,827 B2 | 9/2015 | Chen et al. |
| 9,133,017 B2 | 9/2015 | Liang et al. |
| 9,138,994 B2 | 9/2015 | Peng et al. |
| 9,139,420 B2 | 9/2015 | Chang et al. |
| 9,139,423 B2 | 9/2015 | Chien et al. |
| 9,181,083 B2 | 11/2015 | Tsai et al. |
| 9,187,317 B2 | 11/2015 | Cheng et al. |
| 9,233,839 B2 | 1/2016 | Liu et al. |
| 9,236,877 B2 | 1/2016 | Peng et al. |
| 9,238,581 B2 | 1/2016 | Wu et al. |

(Continued)

OTHER PUBLICATIONS

Martin, D.T. "A Micromachined Dual-Backplate Capacitive Microphone for Aeroacoustic Measurements" Journ. Micro. Elec. Sys. vol. 16, No. 6 Dec. 2007 pp. 1289-1301.*

*Primary Examiner* — Asok K Sarkar
*Assistant Examiner* — Grant Withers
(74) *Attorney, Agent, or Firm* — WPAT, P.C., Intellectual Property Attorneys; Anthony King

(57) ABSTRACT

A MEMS device includes a substrate, a supporter, a first back plate, a second back plate and a diaphragm. The substrate has a cavity. The supporter is over the substrate. The first back plate is over the cavity and fixed on the supporter. The second back plate is over the cavity and fixed on the supporter. The diaphragm is between the first back plate and the second back plate. The diaphragm includes a first sub-diaphragm and a second sub-diaphragm over the cavity and fixed on the supporter.

20 Claims, 13 Drawing Sheets

(56) References Cited

U.S. PATENT DOCUMENTS

| | | | |
|---|---|---|---|
| 2012/0148071 A1* | 6/2012 | Dehe | H04R 1/005 |
| | | | 381/116 |
| 2014/0264661 A1* | 9/2014 | Cheng | B81C 3/001 |
| | | | 257/417 |
| 2014/0287548 A1 | 9/2014 | Lin et al. | |
| 2015/0137303 A1 | 5/2015 | Chou et al. | |
| 2015/0175405 A1 | 6/2015 | Cheng | |
| 2015/0175407 A1 | 6/2015 | Cheng et al. | |
| 2015/0196912 A1 | 7/2015 | Tsai et al. | |
| 2016/0340173 A1* | 11/2016 | Klein | B81B 3/007 |
| 2017/0094402 A1* | 3/2017 | Pahl | H04R 1/222 |

* cited by examiner

MEMS DEVICE AND MANUFACTURING METHOD THEREOF

BACKGROUND

MEMS devices, such as capacitive microphones, are widely used in mobile phones or other electronic products to receive and convert sound waves into electrical signals. Generally, such a microphone includes one or two back plates (electrodes), and a moveable diaphragm separated from the back plate(s) for forming a capacitor.

When the diaphragm is actuated to vibrate relative to the back plate(s) by sound pressure, a distance from the diaphragm to the back plate is changed, and as a result, the capacitance value of the capacitor is accordingly changed, by which voice waves are converted into electrical signals. The diaphragm of the microphone with specific characteristics such as dimension, thickness and rigidity, however, is designed to sense voice waves within a narrow pressure range such as low sound pressure or high sound pressure. Thus, when a wide range of sound pressure encompassing low sound pressure and high sound pressure is required to be sensed, multiple microphones with different specifications are required to independently sense low sound pressure and high sound pressure, which increases layout area of MEMS device.

BRIEF DESCRIPTION OF THE DRAWINGS

Aspects of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
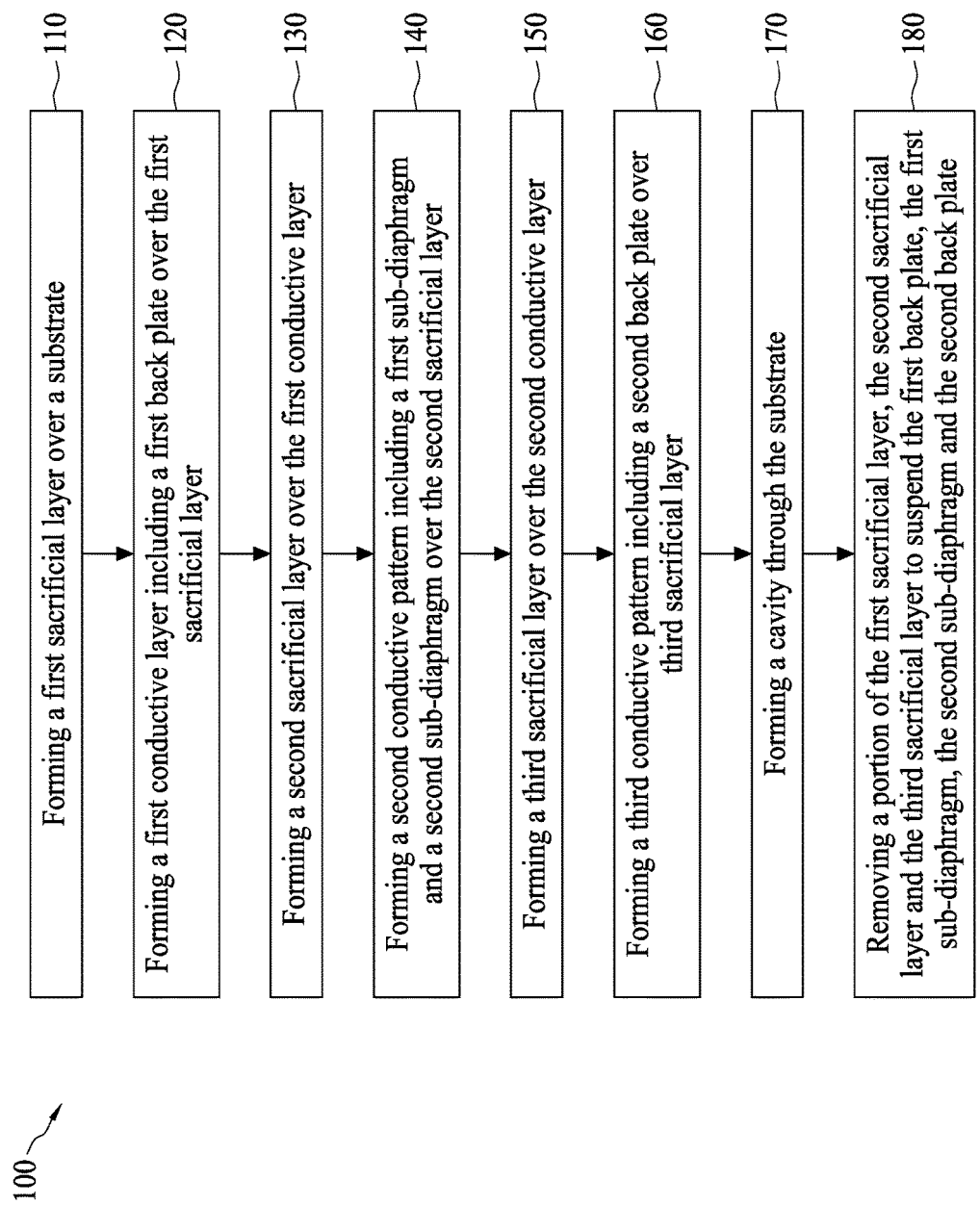
FIG. 1 is a flow chart illustrating a method for manufacturing a MEMS device according to various aspects of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "above", "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first", "second" and "third" describe various elements, components, regions, layers and/or sections, these elements, components, regions, layers and/or sections should not be limited by these terms. These terms may be only used to distinguish one element, component, region, layer or section from another. The terms such as "first", "second", and "third" when used herein do not imply a sequence or order unless clearly indicated by the context.

As used herein, the term "substrate" refers to a base material on which various layers and structures are formed. In some embodiments, the substrate includes a semiconductor substrate, such as a bulk semiconductor substrate. By way of example, the bulk semiconductor substrate includes an elementary semiconductor, such as silicon or germanium; a compound semiconductor, such as silicon germanium, silicon carbide, gallium arsenic, gallium phosphide, indium phosphide, or indium arsenide; or combinations thereof. In some embodiments, the substrate includes a multilayered substrate, such as a silicon-on-insulator (SOI) substrate, which includes a bottom semiconductor layer, a buried oxide layer (BOX) and a top semiconductor layer. In still some embodiments, the substrate includes an insulative substrate, such as a glass substrate, or any other suitable substrate.

As used herein, the term "fixed" refers to a structure directly or indirectly mounted on or in another structure.

As used herein, the term "sacrificial layer" refers to a temporary structural layer formed during fabrication, and will be removed in part or in whole.

As used herein, the term "suspended" refers to a structure spaced away from another structure, thereby allowing the structure is able to move in at least one direction with respective to another structure.

In one or more embodiments of the present disclosure, a MEMS device includes multiple sub-diaphragms designed to have different rigidities and sensitivities for individually sensing sound waves of different sound pressure is provided. The multiple sub-diaphragms are fixed on the same supporter and corresponding to the same cavity, and thus the layout area is reduced.

In one or more embodiments of the present disclosure, a MEMS device includes at least one anchor structure is provided. The anchor structure is interconnected between two back plates and configured to increase the rigidity of the back plates.

FIG. 1 is a flow chart illustrating a method for manufacturing a MEMS device according to various aspects of the present disclosure. The method 100 begins with operation 110 in which a first sacrificial layer is formed over a substrate. The method 100 continues with operation 120 in which a first conductive layer including a first back plate is formed over the first sacrificial layer. The method 100 proceeds with operation 130 in which a second sacrificial layer is formed over the first conductive layer. The method 100 proceeds with operation 140 in which a second conductive layer including a first sub-diaphragm and a second sub-diaphragm is formed over the second sacrificial layer. The method 100 continues with operation 150 in which a third sacrificial layer is formed over the second conductive layer. The method 100 proceeds with operation 160 in which a third conductive layer including a second back plate is formed over the third sacrificial layer. The method 100 continues with operation 170 in which a cavity through the substrate is formed. The method 100 proceeds with operation 180 in which a portion of the first sacrificial layer, the second sacrificial layer and the third sacrificial layer is removed to suspend the first back plate, the first sub-diaphragm, the second sub-diaphragm and the second back plate.

The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the method.

Figure 2A:
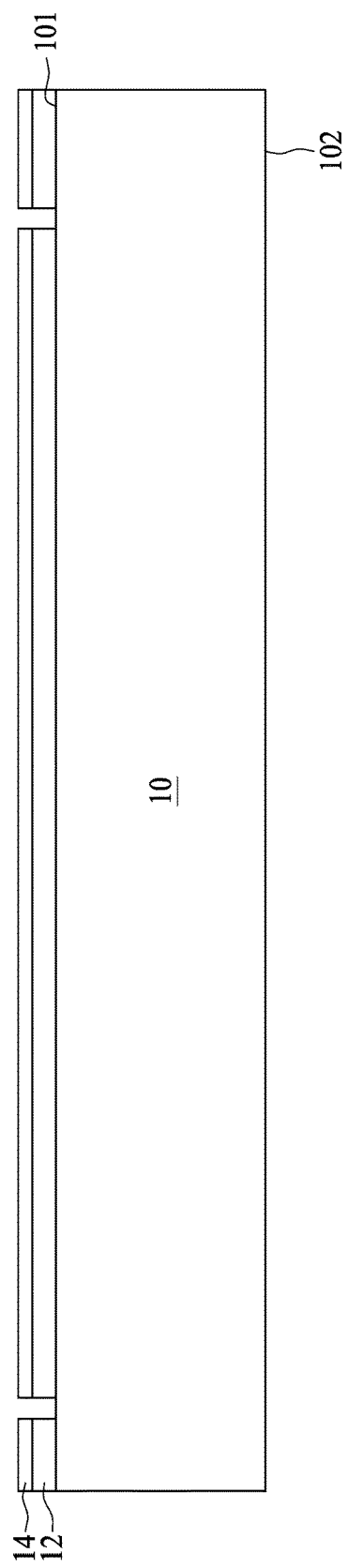
FIGS. 2A, 2B, 2C, 2D, 2E, 2F, 2G, 2H, 2I, 2J and 2K are cross-sectional views at one of various operations of manufacturing a MEMS device according to one or more embodiments of the present disclosure.
Figure 2B:
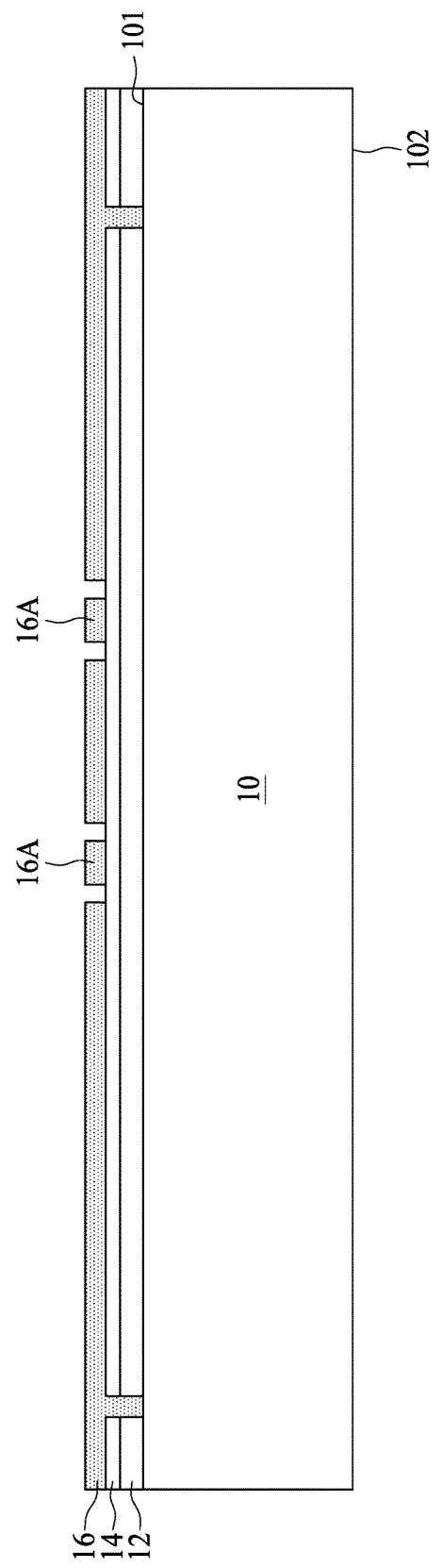
Figure 2C:
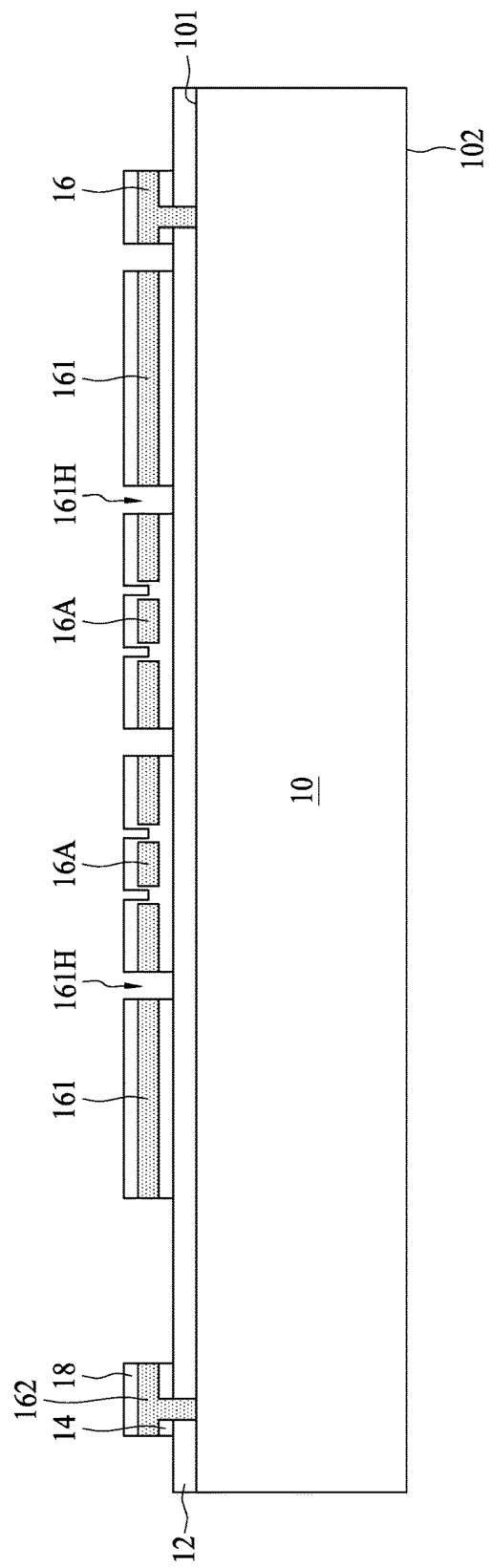
Figure 2D:
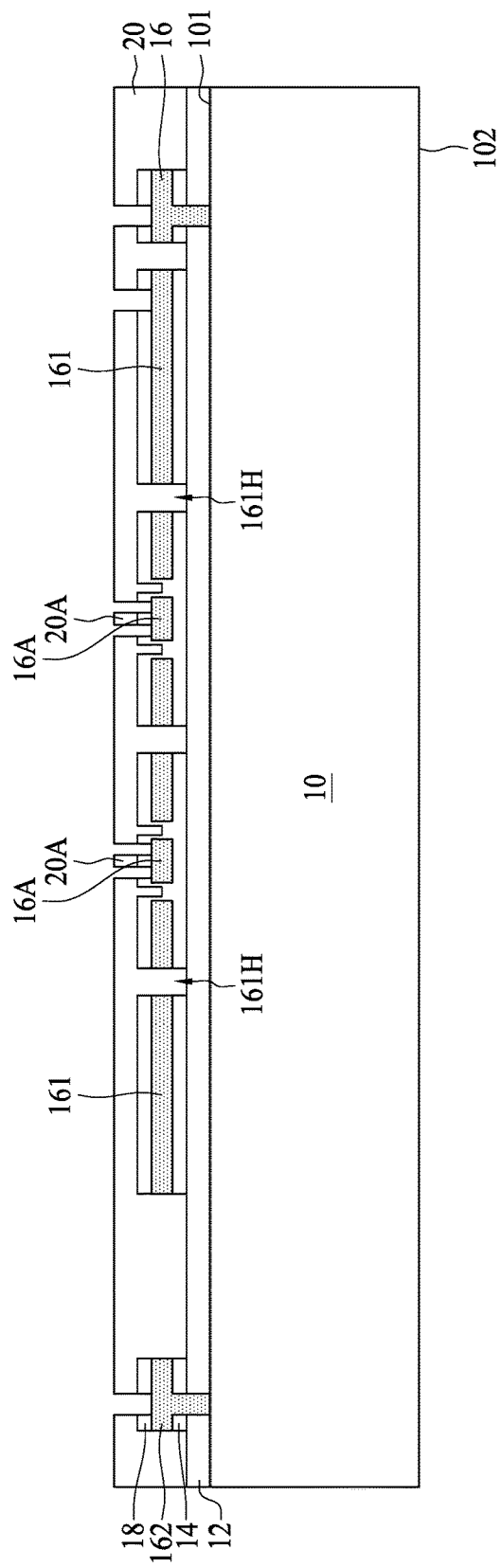
Figure 2E:
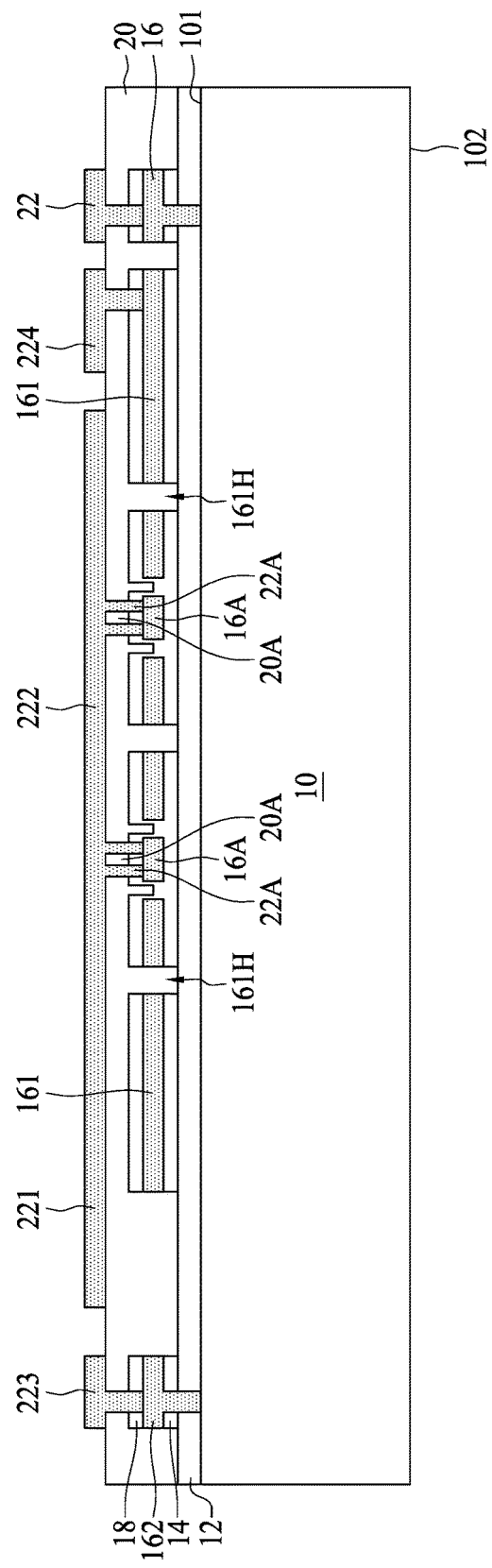
Figure 2F:
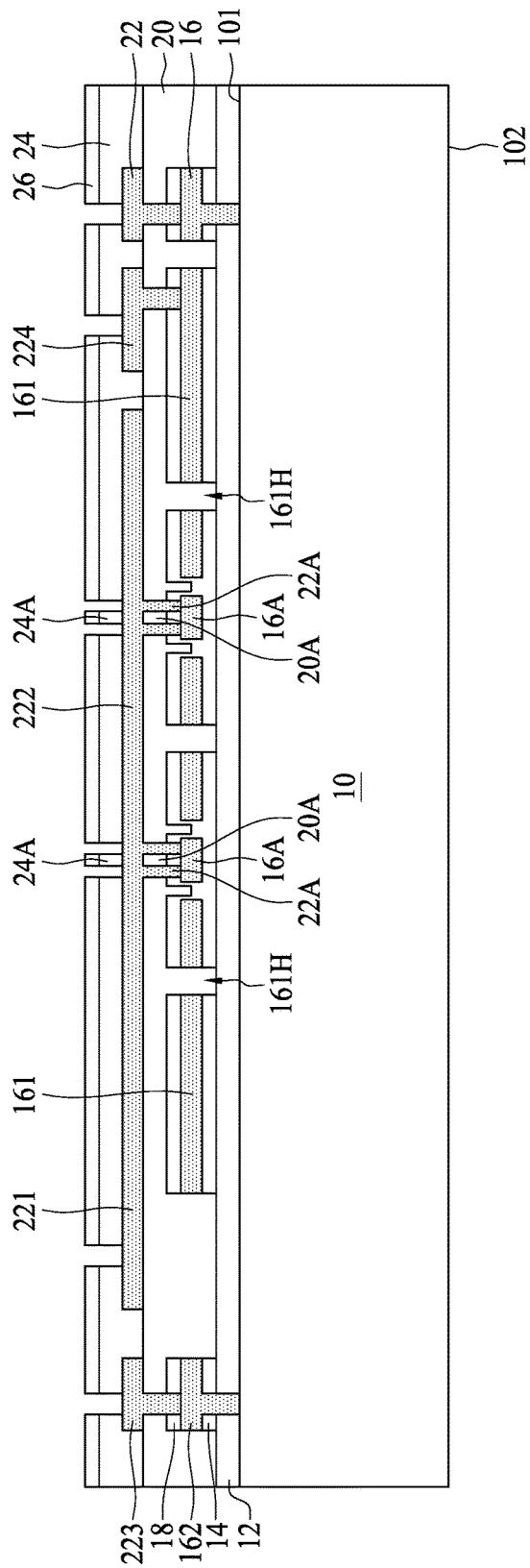
Figure 2G:
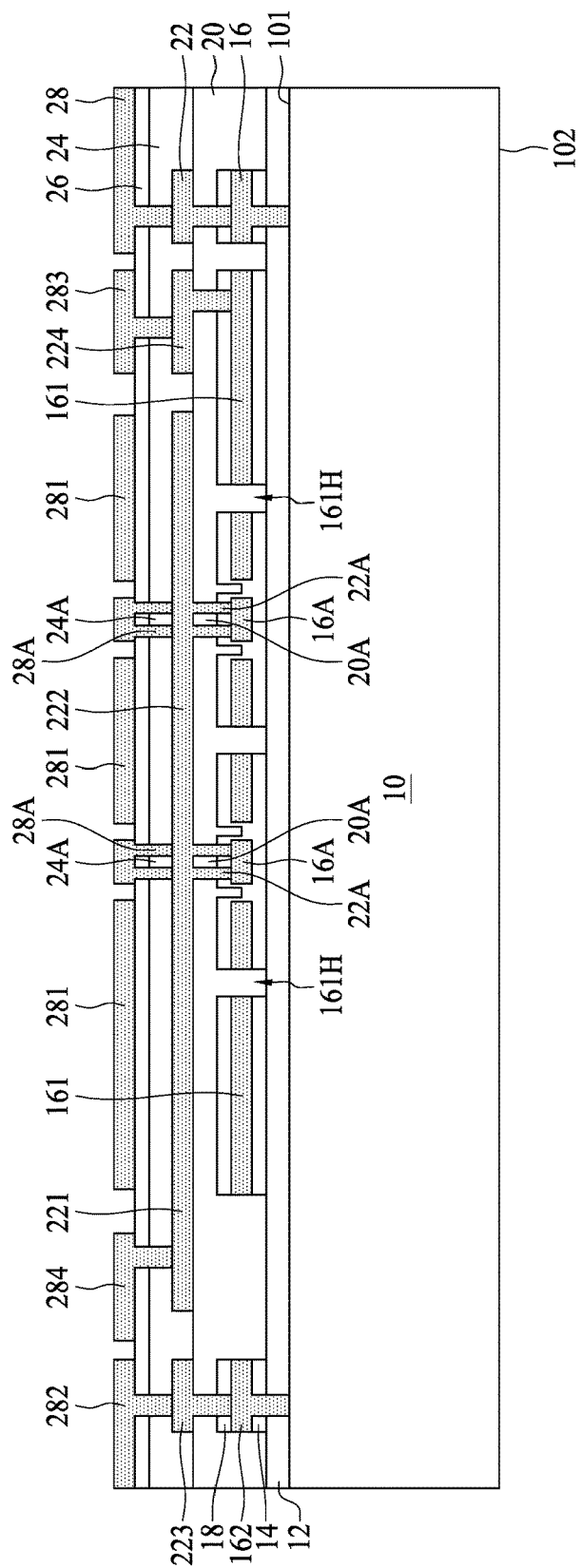
Figure 2H:
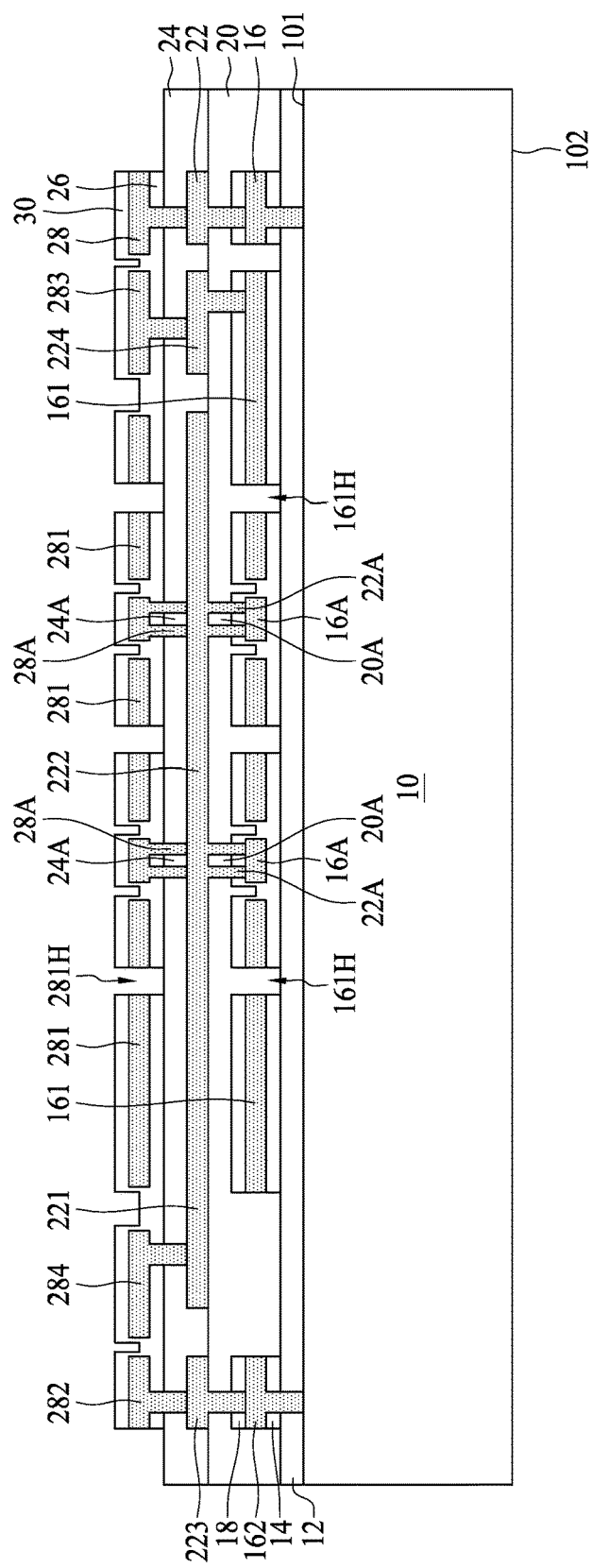
Figure 2I:
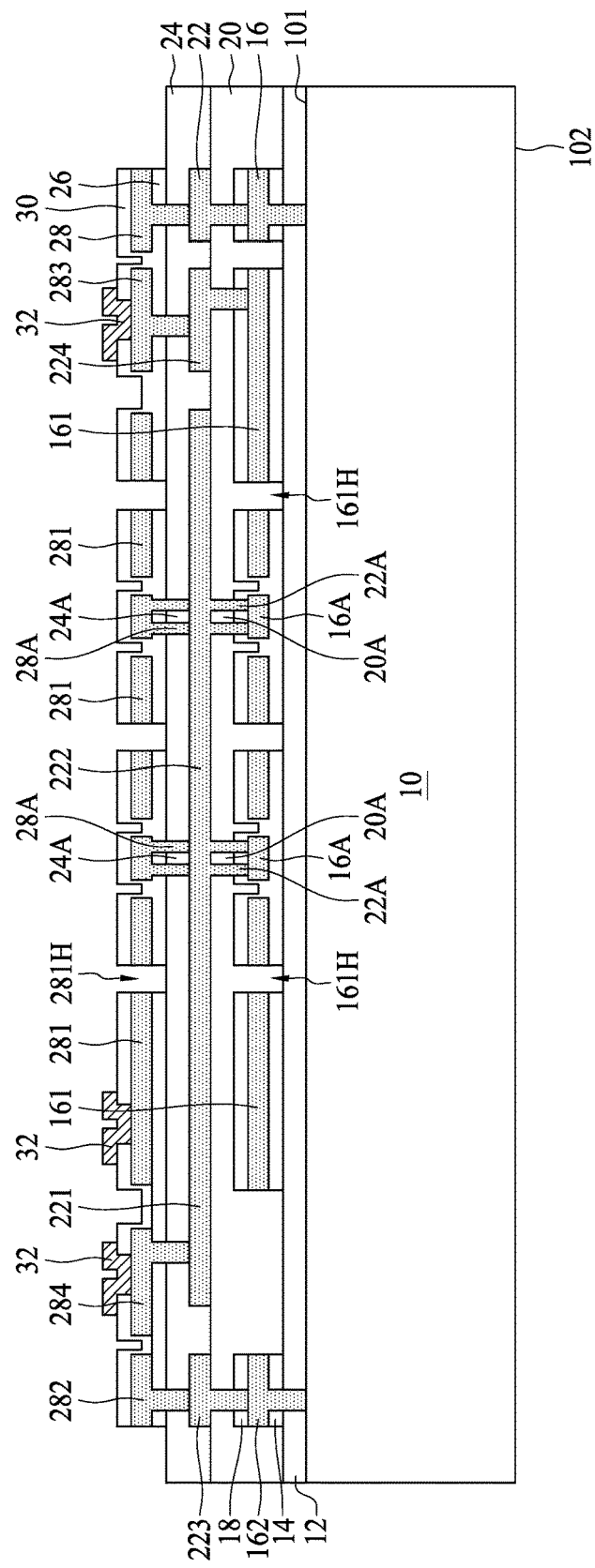
Figure 2J:
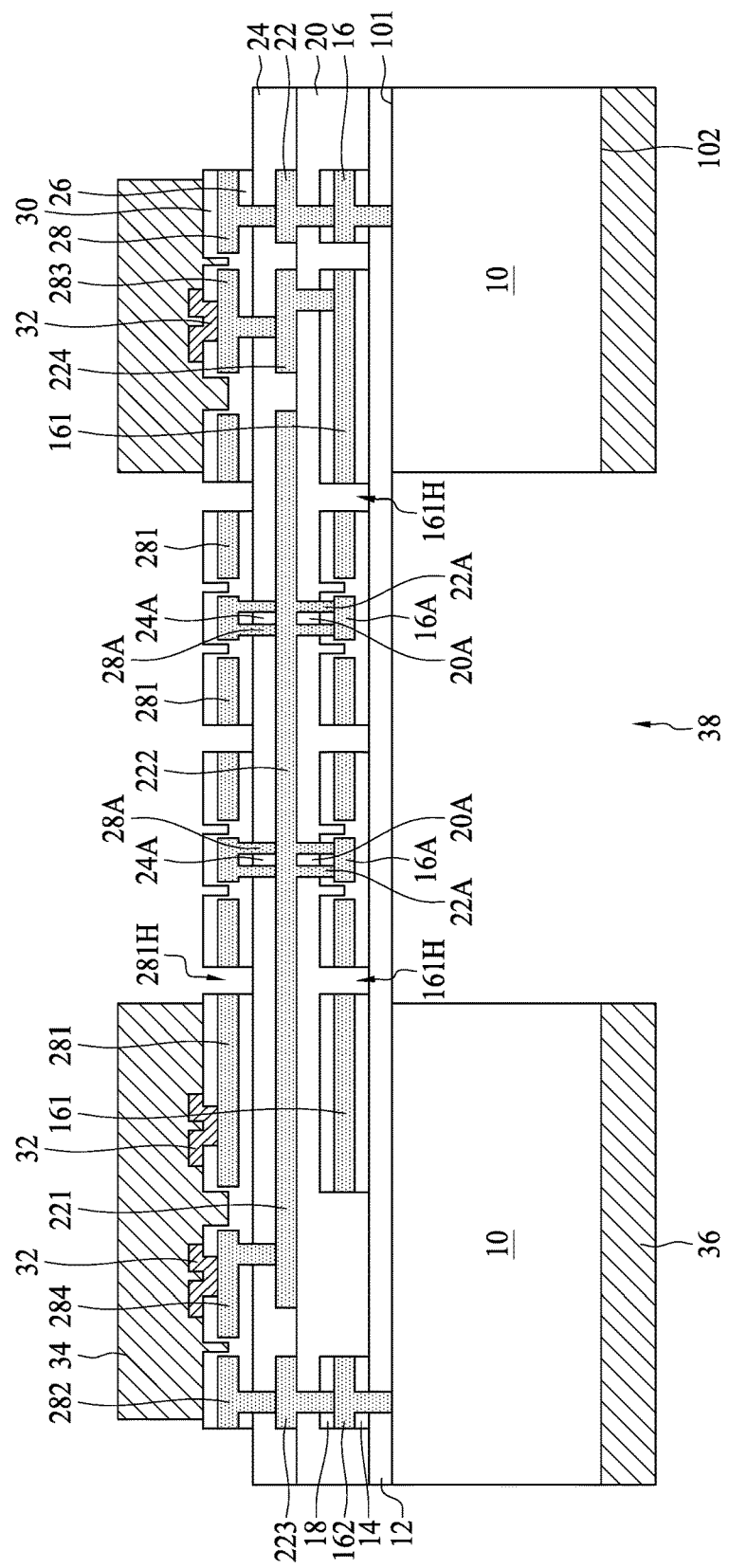
Figure 2K:
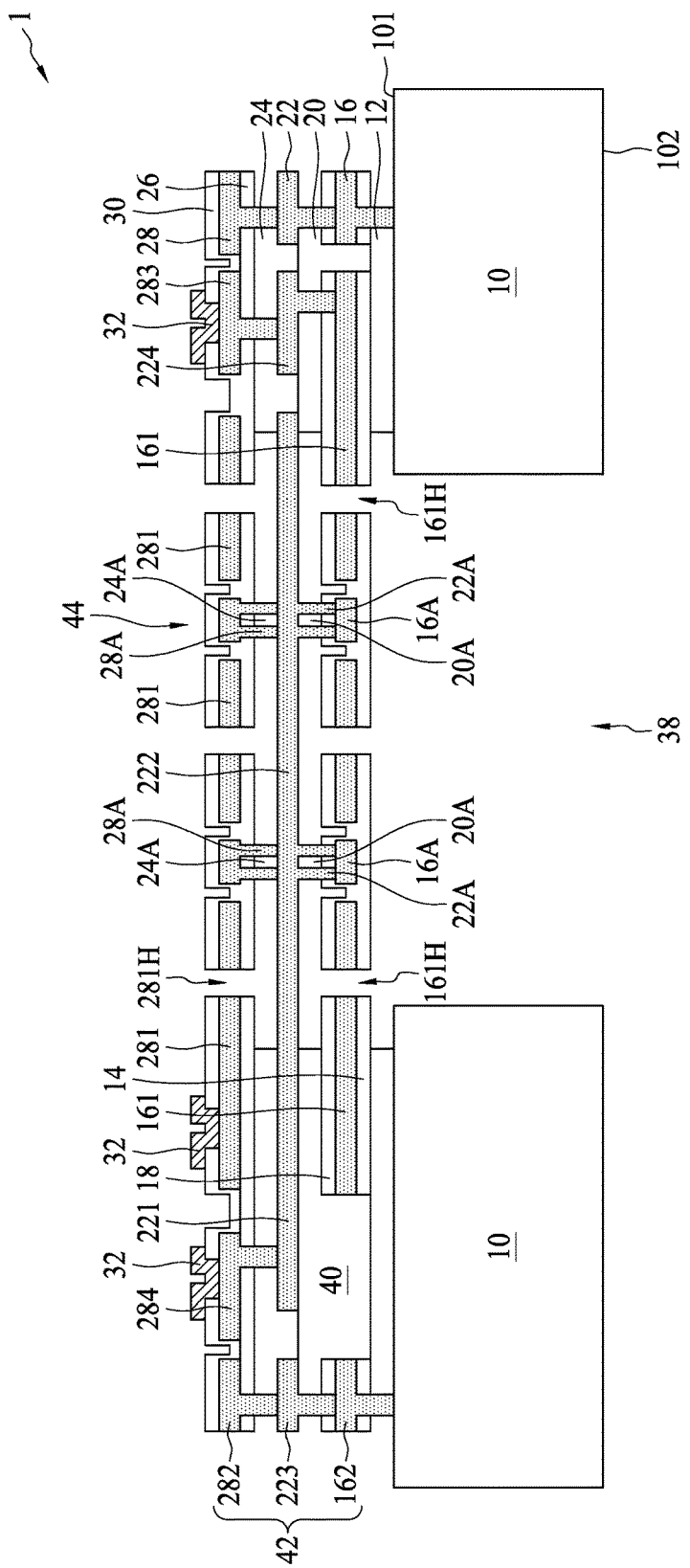
Figure 2L:
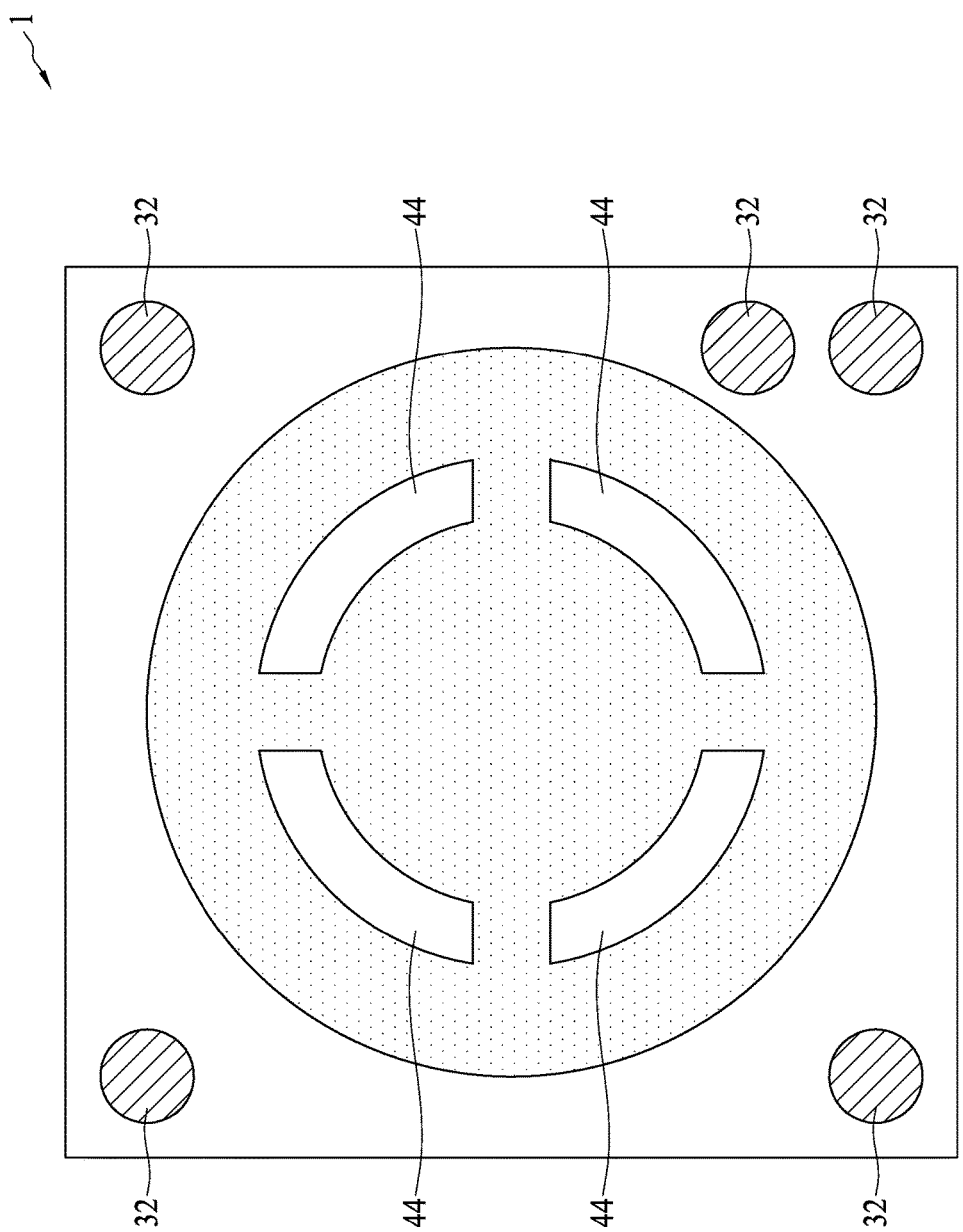
FIG. 2L is a schematic top view of a MEMS device according to one or more embodiments of the present disclosure.

FIGS. 2A, 2B, 2C, 2D, 2E, 2F, 2G, 2H, 2I, 2J and 2K are cross-sectional views at one of various operations of manufacturing a MEMS device according to one or more embodiments of the present disclosure, and FIG. 2L is a schematic top view of a MEMS device according to one or more embodiments of the present disclosure. As depicted in FIG. 2A, a substrate 10 having a first surface 101 and a second surface 102 opposite to each other is provided. In one or more embodiments, the substrate 10 is a semiconductor substrate such as a silicon substrate, but not limited thereto. In one or more embodiments, electronic devices such as active devices and/or passive devices, or conductive wirings are formed in the substrate 10. A first sacrificial layer 12 is formed over the first surface 101 of the substrate 10. In one or more embodiments, the first sacrificial layer 12 is an oxide layer such as a silicon oxide layer. In some embodiments, a first insulation layer 14 is formed over the first sacrificial layer 12. In one or more embodiments, the first insulation layer 14 is a nitride layer such as a silicon nitride layer. In some embodiments, the first insulation layer 14 and the first sacrificial layer 12 are patterned, for example, by etching to expose a portion of the first surface 101 of the substrate 10. In one or more embodiments, the exposed portion of the first surface 101 is configured to provide an electrical connection path to the substrate 10.

As depicted in FIG. 2B, a first conductive layer 16 is formed over the first insulation layer 14 and the first sacrificial layer 12, and the first conductive layer 16 is patterned to form several island structures 16A disconnected from other portion of the first conductive layer 16. In one or more embodiments, the material of the first conductive layer 16 is polycrystalline silicon, but not limited thereto.

As depicted in FIG. 2C, a second insulation layer 18 is formed over the first conductive layer 16. In one or more embodiments, the material of the second insulation layer 18 is the same as, but not limited to, the first insulation layer 14. For example, the second insulation layer 18 is a nitride layer such as a silicon nitride layer. The second insulation layer 18, the first conductive layer 16 and the first insulation layer 14 are patterned, for example, by etching. The first conductive layer 16, after patterning, includes a first back plate 161. In one or more embodiments, the first back plate 161 includes a plurality of acoustic holes 161H. In one or more embodiments, the first conductive layer 16 further includes a first partition 162 surrounding the first back plate 161 and the island structures 16A.

As depicted in FIG. 2D, a second sacrificial layer 20 is formed over the first conductive layer 16 and the second insulation layer 18. In one or more embodiments, the material of the second sacrificial layer 20 is the same as, but not limited to, the first sacrificial layer 12. For example, the second sacrificial layer 20 is an oxide layer such as a silicon oxide layer. In one or more embodiments, the second sacrificial layer 20 is planarized such as by chemical mechanical polishing (CMP). The second sacrificial layer 20 and the second insulation layer 18 are then patterned to expose a portion of the first partition 162, the island structure 16A and the first back plate 161. In some embodiments, the patterned second sacrificial layer 20 includes several first insulation portions 20A, and each first insulation portion 20A is over the corresponding island structure 16A.

As depicted in FIG. 2E, a second conductive layer 22 is formed over the second sacrificial layer 20. In one or more embodiments, the material of the second conductive layer 22 is polycrystalline silicon, but not limited thereto. The second conductive layer 22 is patterned to form a diaphragm. In one or more embodiments, the diaphragm includes a first sub-diaphragm 221 and a second sub-diaphragm 222. In one or more embodiments, the first sub-diaphragm 221 and the second sub-diaphragm 222 are connected to each other, and may include several vent holes (not shown). In one or more embodiments, the second conductive layer 22 further includes a second partition 223 over and connected to the first partition 162, and the second partition 223 is disconnected from the first sub-diaphragm 221 and the second sub-diaphragm 222. In one or more embodiments, the second conductive layer 22 further includes a first connection structure 224 electrically connected to the first back plate 161, and the first connection structure 224 is disconnected from the second partition 223, the first sub-diaphragm 221 and the second sub-diaphragm 222. In one or more embodiments, the second conductive layer 22 also includes several first via walls 22A, and each first via wall 22A surrounds the corresponding first insulation portion 20A. The upper surface of the first insulation portion 20A is covered and the lateral side of the first insulation portion 20A is surrounded by the first via wall 22A, while the bottom surface of the first insulation portion 20A is covered by the island structure 16A. Accordingly, the first insulation portion 20A is enclosed by the first via wall 22A and the island structure 16A.

As depicted in FIG. 2F, a third sacrificial layer 24 is formed over the second conductive layer 22. In one or more embodiments, the material of the third sacrificial layer 24 is the same as, but not limited to, the first sacrificial layer 12. For example, the third sacrificial layer 24 is an oxide layer such as a silicon oxide layer. In one or more embodiments, the third sacrificial layer 24 is planarized, for example by chemical mechanical polishing (CMP). Subsequently, a third insulation layer 26 is formed over the third sacrificial layer 24. In one or more embodiments, the material of the third insulation layer 26 is the same as, but not limited to, the first insulation layer 14. For example, the third insulation layer 26 is a nitride layer such as a silicon nitride layer. The third insulation layer 26 and the third sacrificial layer 24 are patterned, for example by etching to expose a portion of the first sub-diaphragm 221, the second sub-diaphragm 222, the second partition 223, the first connection structure 224, and the first via wall 22A. In some embodiments, the patterned third sacrificial layer 24 includes several second insulation portions 24A, and each second insulation portions 24A is over the corresponding first via wall 22A.

As depicted in FIG. 2G, a third conductive layer 28 is formed over the third insulation layer 26 and the third sacrificial layer 24. In one or more embodiments, the material of the third conductive layer 28 is a polycrystalline silicon, but not limited thereto. The third conductive layer 28 is then patterned, for example by etching to form a second back plate 281. In one or more embodiments, the third conductive layer 28 further includes a third partition 282 over and connected to the second partition 223, and the third partition 282 is disconnected from the second back plate 281. In one or more embodiments, the third conductive layer 28 further includes a second connection structure 283 and a third connection structure 284 disconnected from each other. The second connection structure 283 is electrically connected to the first connection structure 224, and the third connection structure 284 electrically connected to the first sub-diaphragm 221 and the second sub-diaphragm 222. In one or more embodiments, the third conductive layer 28 further includes several second via walls 28A, and each second via wall 28A surrounds the corresponding second insulation portion 24A. The upper surface of the second insulation portion 24A is covered and the lateral side of the second insulation portion 24A is surrounded by the second via wall 28A, while the bottom surface of the second insulation portion 20A is covered by the first via wall 22A. Accordingly, the second insulation portion 24A is enclosed by the first via wall 22A and the second via wall 28A.

As depicted in FIG. 2H, a fourth insulation layer 30 is formed over the third conductive layer 28. In one or more embodiments, the material of the fourth insulation layer 30 is the same as, but not limited to, the first insulation layer 14. For example, the fourth insulation layer 30 is a nitride layer such as a silicon nitride layer. The fourth insulation layer 30, the third conductive layer 28 and the third insulation layer 26 are then patterned, for example by etching to form a plurality of acoustic holes 281H.

As depicted in FIG. 2I, the fourth insulation layer 30 is patterned, e.g. by etching to expose some portions of the third conductive layer 28, and several contact pads 32 are formed to electrically connect the first back plate 161, the second back plate 281, and the first sub-diaphragm 221 and the second sub-diaphragm 222 respectively. The material of the contact pads 32 is conductive material such as metal or alloy. In one or more embodiments, the first back plate 161 is electrically connected to the corresponding contact pad 32 through the first connection structure 224 and the second connection structure 283. The first sub-diaphragm 221 and the second sub-diaphragm 222 are electrically connected to the corresponding contact pad 32 through the third connection structure 284. In one or more embodiments, the thickness of the substrate 10 is thinned from the second surface 102 to a desired thickness. In some embodiments, the desired thickness is, but not limited to, between 200 and 600 micrometers.

As depicted in FIG. 2J, a first resist pattern 34 and a second resist pattern 36 are respectively formed over the first surface 101 and the second surface 102 of the substrate 10. In one or more embodiments, the material of the first resist pattern 34 and the second resist pattern 36 includes photoresist. The substrate 101 is then etched from the second surface 102 using the second resist pattern 34 as an etch mask to form a cavity 38 through the substrate 10, exposing a portion of the first sacrificial layer 12.

As depicted in FIGS. 2K and 2L, a portion of the first sacrificial layer 12, the second sacrificial layer 20 and the third sacrificial layer 24 are removed, for example by etching using the first resist pattern 34 and the second resist pattern 36 as etch masks. Subsequently, the first resist pattern 34 and the second resist pattern 36 are removed to form a MEMS device 1. In some embodiments, the first sacrificial layer 12, the second sacrificial layer 20 and the third sacrificial layer 24 are etched by wet etching using an etchant solution such as buffered oxide etchant (BOE). In some alternative embodiments, the first sacrificial layer 12, the second sacrificial layer 20 and the third sacrificial layer 24 are etched by dry etching using an etchant gas such as hydrofluoric (HF) vapor. The remaining portion of the first sacrificial layer 12, the second sacrificial layer 20 and the third sacrificial layer 24 form a supporter 40. A portion of the first back plate 161, the second back plate 281 and the diaphragm is fixed on the supporter 40, while another portion of the first back plate 161, the second back plate 281 and the diaphragm is suspended over the cavity 38 and able to be driven by sound pressure to vibrate. In one or more embodiments, the first partition 162, the second partition 223 and the third partition 282 form a partition structure 42. The partition structure 42 surrounds an outer edge of the first sacrificial layer 12, the second sacrificial layer 20 and the third sacrificial layer 24, and thus the supporter 40 is isolated from the etchant during formation of the cavity 38. In one or more embodiments, the partition structure 42 is electrically connected to the substrate 10, and provided with a reference electrically potential or grounded. The first insulation portion 20A is enclosed by the island structure 16A and the first via wall 22A, and the second insulation portion 24A is enclosed by the first via wall 22A and the second via wall 28A. Accordingly, the first insulation portion 20A and the second insulation portion 24A are not etched during etching of the first sacrificial layer 12, the second sacrificial layer 20 and the third sacrificial layer 24.

In one or more embodiments, the MEMS device 1 is configured as a microphone. The first sub-diaphragm 221 and the second sub-diaphragm 222 are located over the same cavity 38, and thus layout area is minimized. The anchor structure 44 is configured to divide the diaphragm into multiple sub-diaphragms such as the first sub-diaphragm 221 and the second sub-diaphragm 222 with different characteristics such as dimension, thickness and rigidity, and thus the multiple sub-diaphragms can be used to sense a wide range of sound pressure. The first via wall 22A, the first insulation portion 20A, the second via wall 28A and the second insulation portion 24A form an anchor structure 44. In one or more embodiments, the anchor structure 44 is structurally connected to the first back plate 161 and the second back plate 281, but electrically disconnected from the first back plate 161 and the second back plate 281. In one or more embodiments, the anchor structure 44 is connected to the first back plate 161 through the first insulation layer 14 and the second insulation layer 18, and connected to the second back plate 281 through the third insulation layer 26 and the fourth insulation layer 30. The anchor structure 44 is also interconnected to the first sub-diaphragm 221 and the second sub-diaphragm 222. Accordingly, the anchor structure 44 is less vibratable than the first sub-diaphragm 221 and the second sub-diaphragm 222. In one or more embodiments, the anchor structure 44 is configured as a node when the diaphragm is vibrated. In one or more embodiments, the first sub-diaphragm 221 is configured to be responsive to low sound pressure, and the second sub-diaphragm 222 is configured to be responsive to high sound pressure. In one or more embodiments, the anchor structure 44 is also configured to improve the rigidity of the first back plate 161 and the second back plate 281, such that the first back plate 161 and the second back plate 281 are not as vibratable as the first sub-diaphragm 221 and the second sub-diaphragm 222. Accordingly, the sensitivities of the first sub-diaphragm 221 and the second sub-diaphragm 222 are improved.

In the present disclosure, the MEMS microphone includes multiple sub-diaphragms designed to have different rigidities and sensitivities for individually sensing sound waves of different sound pressure. The multiple sub-diaphragms are fixed on the same supporter and corresponding to the same cavity, and thus the layout area is reduced. The anchor structure is configured to divide the diaphragm into multiple sub-diaphragms. The anchor structure is configured to increase the rigidity of the back plates, which can increase the capacitance variation, thereby increase the sensitivity of the MEMS microphone.

In one exemplary aspect, a MEMS device includes a substrate, a supporter, a first back plate, a second back plate and a diaphragm. The substrate has a cavity. The supporter is over the substrate. The first back plate is over the cavity and fixed on the supporter. The second back plate is over the cavity and fixed on the supporter. The diaphragm is between the first back plate and the second back plate. The diaphragm includes a first sub-diaphragm and a second sub-diaphragm over the cavity and fixed on the supporter.

In another exemplary aspect, a MEMS device includes a substrate, a supporter, a first back plate, a second back plate, a diaphragm and at least one anchor structure. The substrate has a cavity. The supporter is over the substrate. The first back plate is over the cavity and fixed on the supporter. The second back plate is over the cavity and fixed on the supporter. The diaphragm is between the first back plate and the second back plate, and the diaphragm is over the cavity and fixed on the supporter. The anchor structure is between the first back plate and the second back plate, and connected to the diaphragm.

In yet another aspect, a method for manufacturing a MEMS device includes forming a first sacrificial layer over a substrate; forming a first conductive layer including a first back plate over the first sacrificial layer; forming a second sacrificial layer over the first conductive layer; forming a second conductive layer including a first sub-diaphragm and a second sub-diaphragm over the second sacrificial layer; forming a third sacrificial layer over the second conductive layer; forming a third conductive layer including a second back plate over the third sacrificial layer; forming a cavity through the substrate; and removing a portion of the first sacrificial layer, the second sacrificial layer and the third sacrificial layer to suspend the first back plate, the first sub-diaphragm, the second sub-diaphragm and the second back plate.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A MEMS device, comprising:
    a substrate having a cavity;
    a supporter over the substrate;
    a partition structure covering an edge of the supporter, wherein the partition structure is covered with a plurality of insulation layers;
    a first back plate over the cavity and fixed on the supporter;
    a second back plate over the cavity and fixed on the supporter;
    a diaphragm between the first back plate and the second back plate, wherein the diaphragm includes a first sub-diaphragm and a second sub-diaphragm over the cavity and fixed on the supporter; and
    at least one anchor structure between the first back plate and the second back plate, and connected to the first sub-diaphragm and the second sub-diaphragm, wherein the anchor structure includes an insulation portion, and a via wall surrounding the insulation portion.

2. The MEMS device of claim 1, wherein the first back plate and the second back plate are covered with the plurality of insulation layers.

3. The MEMS device of claim 1, wherein the first back plate or the second back plate includes a plurality of acoustic holes.

4. The MEMS device of claim 1, wherein a material of the first back plate, the second back plate and the diaphragm includes polycrystalline silicon.

5. The MEMS device of claim 1, further comprising a plurality of contact pads electrically connected to the first back plate, the second back plate, the first sub-diaphragm and the second sub-diaphragm, respectively.

6. The MEMS device of claim 1, wherein the first back plate and the second back plate are electrically disconnected from the anchor structure.

7. The MEMS device of claim 1, wherein the partition structure comprises a plurality of portions stacked to one another.

8. The MEMS device of claim 7, wherein the plurality of portions of the partition structure comprises conductive portions.

9. The MEMS device of claim 1, further comprising a plurality of contact pads electrically connected to the first back plate, the second back plate, and the first sub-diaphragm and the second sub-diaphragm.

10. A MEMS device, comprising:
    a substrate having a cavity;
    a supporter over the substrate;
    a first back plate over the cavity and fixed on the supporter;
    a second back plate over the cavity and fixed on the supporter;
    a diaphragm between the first back plate and the second back plate, wherein the diaphragm is over the cavity and fixed on the supporter; and
    at least one anchor structure between the first back plate and the second back plate, and connected to the diaphragm, wherein the anchor structure is electrically connected to the diaphragm, and the anchor structure includes an insulation portion, and a via wall surrounding the insulation portion.

11. The MEMS device of claim 10, wherein the first back plate and the second back plate are electrically disconnected from the anchor structure.

12. The MEMS device of claim 10, wherein the first back plate and the second back plate are covered with insulation layers.

13. The MEMS device of claim 12, wherein the anchor structure is structurally connected to the insulation layers.

14. The MEMS device of claim 10, wherein the diaphragm includes a first sub-diaphragm and a second sub-diaphragm over the cavity and fixed on the supporter, and the first sub-diaphragm and the second sub-diaphragm are connected to each other via the anchor structure.

15. The MEMS device of claim 14, further comprising a plurality of contact pads electrically connected to the first back plate, the second back plate, and the first sub-diaphragm and the second sub-diaphragm.

16. The MEMS device of claim 10, further comprising a partition structure surrounding the supporter.

17. A MEMS device, comprising:
- a supporter;
- a first back plate fixed on the supporter;
- a second back plate fixed on the supporter;
- a diaphragm between the first back plate and the second back plate, wherein the diaphragm includes a first sub-diaphragm and a second sub-diaphragm; and
- an anchor structure between the first back plate and the second back plate, and connected between the first sub-diaphragm and the second sub-diaphragm of the diaphragm, wherein the anchor structure is electrically connected to the diaphragm, and the anchor structure includes an insulation portion, and a via wall surrounding the insulation portion.

18. The MEMS device of claim 17, wherein the first back plate and the second back plate are electrically disconnected from the anchor structure.

19. The MEMS device of claim 17, further comprising a partition structure covering an edge of the supporter.

20. The MEMS device of claim 17, wherein at least one of the first back plate and the second back plate includes a plurality of acoustic holes.

* * * * *